United States Patent
Jiang (10) Patent No.: US 8,644,790 B2
(45) Date of Patent: Feb. 4, 2014

(54) AUTOMOBILE TOP ANTENNA DEVICES AND ANTENNA AMPLIFIERS THEREOF

(75) Inventor: Xiaoping Jiang, Taizhou (CN)

(73) Assignee: Taizhou Suzhong Antenna Group Co., Taizhou (CN)

( * ) Notice: Subject to any disclaimer, the term of this patent is extended or adjusted under 35 U.S.C. 154(b) by 766 days.

(21) Appl. No.: 12/701,348

(22) Filed: Feb. 5, 2010

(65) Prior Publication Data
US 2010/0136936 A1    Jun. 3, 2010

Related U.S. Application Data (63) Continuation of application No. PCT/CN2008/070561, filed on Mar. 21, 2008.

(30) Foreign Application Priority Data

Dec. 26, 2007 (CN) .......................... 2007 1 0192378

(51) Int. Cl.
    *H04B 1/16* (2006.01)
(52) U.S. Cl.
    USPC ........... 455/345; 343/711; 343/712; 343/713; 455/131; 455/344; 455/130; 455/347
(58) Field of Classification Search
    USPC ............................ 343/713, 704, 860; 455/132
    See application file for complete search history.

(56) References Cited

U.S. PATENT DOCUMENTS

| | | | |
|---|---|---|---|
| 2,598,671 A * | 6/1952 | Boothby | .................... 333/207 |
| 4,085,405 A | 4/1978 | Barlow | |
| 4,222,121 A * | 9/1980 | Matsumoto et al. | ....... 455/164.2 |
| 5,390,557 A | 2/1995 | Tsukada | |
| 5,790,079 A * | 8/1998 | Zafar | ............................. 343/713 |

(Continued)

FOREIGN PATENT DOCUMENTS

| | | |
|---|---|---|
| CN | 1841843 A | 10/2006 |
| CN | 101000977 | 7/2007 |

(Continued)

OTHER PUBLICATIONS

The State Intellectual Property Office, "International Search Report," issued in connection with International Application No. PCT/CN2008/070561, mailed Oct. 16, 2008, 6 pages (includes original Chinese report and its English translation).

(Continued)

*Primary Examiner* — Lewis West
*Assistant Examiner* — Richard Chan
(74) *Attorney, Agent, or Firm* — Hanley, Flight & Zimmerman, LLC (57) ABSTRACT

Antenna amplifiers and automobile top antenna devices are provided. The antenna amplifier includes an AM frequency selection circuit, an AM signal amplification circuit, an FM frequency selection circuit, an FM signal amplification circuit, and a power circuit. The antenna amplifier is further provided with a trap circuit that has an end connected to the ground terminal of the antenna amplifier, and another end connected to a metal mounting base for an antenna on the automobile top. The antenna device includes a shark-fin antenna case, a metal mounting base, an antenna support and a radio receiving antenna. The antenna case is mounted on the metal mounting base to form an internal accommodation space in which the antenna support, the radio receiving antenna and a circuit board with an antenna amplifier are provided.

16 Claims, 8 Drawing Sheets

(56) References Cited

U.S. PATENT DOCUMENTS

| | | | |
|---|---|---|---|
| 5,883,599 A * | 3/1999 | Hall | 343/713 |
| 5,907,308 A * | 5/1999 | Oka et al. | 343/713 |
| 5,995,064 A * | 11/1999 | Yanagisawa et al. | 343/895 |
| 6,239,758 B1 * | 5/2001 | Fuchs et al. | 343/713 |
| 6,456,832 B1 * | 9/2002 | Yanagisawa et al. | 455/193.1 |
| 6,737,973 B2 * | 5/2004 | Jesme | 340/572.1 |
| 6,909,326 B2 * | 6/2005 | Jesme | 330/251 |
| 6,954,120 B2 * | 10/2005 | Friese et al. | 333/185 |
| 2005/0068237 A1 | 3/2005 | Noro et al. | |
| 2007/0293182 A1 * | 12/2007 | Sorrells et al. | 455/319 |

FOREIGN PATENT DOCUMENTS

| | | |
|---|---|---|
| CN | 101000977 A | 7/2007 |
| CN | 200956584 | 10/2007 |
| CN | 200956584 Y | 10/2007 |
| CN | 101217213 A | 7/2008 |
| EP | 1170822 | 1/2002 |
| JP | 11191712 | 7/1999 |
| JP | 2002505541 | 2/2002 |
| WO | 9944300 | 9/1999 |
| WO | 2009082885 | 7/2009 |

OTHER PUBLICATIONS

Japanese Patent Office, "Notification of Reasons for Refusal", issued in connection with Chinese patent application No. 2010512494, Apr. 23, 2012, (5 pages). English translation not available.

Korean Patent Office, "Notice of Rejection", issued in connection with Korean patent application No. 520100154389, Mar. 16, 2012, (3 pages). English translation not available.

Korean Patent Office, "Office action", issued in connection with Korean patent application No. 520100154389, Mar. 9, 2011, (6 pages). English translation not available.

European Patent Office, "Extended European Search Report", issued in connection with European patent application No. 08715297.1, Mar. 17, 2011, (28 pages).

* cited by examiner

AUTOMOBILE TOP ANTENNA DEVICES AND ANTENNA AMPLIFIERS THEREOF

FIELD OF THE DISCLOSURE

The present disclosure relates to antenna devices, particularly to automobile top antenna devices and antenna amplifiers therefor.

BACKGROUND

The automobile antenna widely used at present is the top rod antenna. But the rod antenna is long and will affect the aesthetics of the entire vehicle when being arranged at the top of the automobile. In addition, the common antennas usually have the defect of being vulnerable, and it is inconvenient for the automobile to be washed or enter a limited space when the antenna is too high. Besides, during usage, the antenna pole is easy to be dropped off, and the antenna shall be dismounted during the transportation, which is also inconvenient. Although there occurs a shark-fin shaped antenna of low height and aesthetic appearance (e.g., Chinese patent application CN1841843A), the mounting position of the antenna inside the case is limited, and the antenna is rather close to the automobile top, thus the radio signals are absorbed by the iron plate on the top of the automobile, and the receiving performance of the antenna is seriously deteriorated.

BRIEF DESCRIPTION OF THE DRAWINGS

The following drawings are only provided as example schematic descriptions and explanations. The disclosed invention is not limited thereto.

DETAILED DESCRIPTION

Referring to FIGS. 1 to 8, example automobile top antenna devices are disclosed. In some examples, the antenna device is a radio signal receiving antenna for automobile, and the antenna amplifier is adaptable to be used as a device for receiving AM/FM radio broadcast. An example antenna device comprises an antenna case 1, a metal mounting base 6, an antenna support 3 and a radio receiving antenna 2. The antenna case 1 is mounted on the metal mounting base 6 to form an internal accommodation space in which the antenna support 3, the radio receiving antenna 2 and a circuit board 4 are provided. The antenna support 3 and the circuit board 4 are provided on the metal mounting base 6. The radio receiving antenna 2 is provided on the antenna support 3, or imbedded by injection molding or clamped by fixation to an upper part inside the antenna case. One end of the radio receiving antenna 2 is provided with an antenna signal output terminal connected to a signal input terminal of the antenna amplifier of the circuit board through a conductor wiring 5. An output signal of the antenna amplifier is outputted to a radio receiving device through a coaxial cable 7. The antenna amplifier is connected with a power line 8 that supplies power to the antenna amplifier. The antenna amplifier is further provided with a trap circuit that has one end connected to the ground terminal of the antenna amplifier, and the other end connected to the metal mounting base for the antenna on the automobile top.

In a disclosed example, the radio receiving antenna 2 is an AM/FM shared antenna of a metal helical shape with the resonant frequency of 98±3 MHz.

Figure 4:
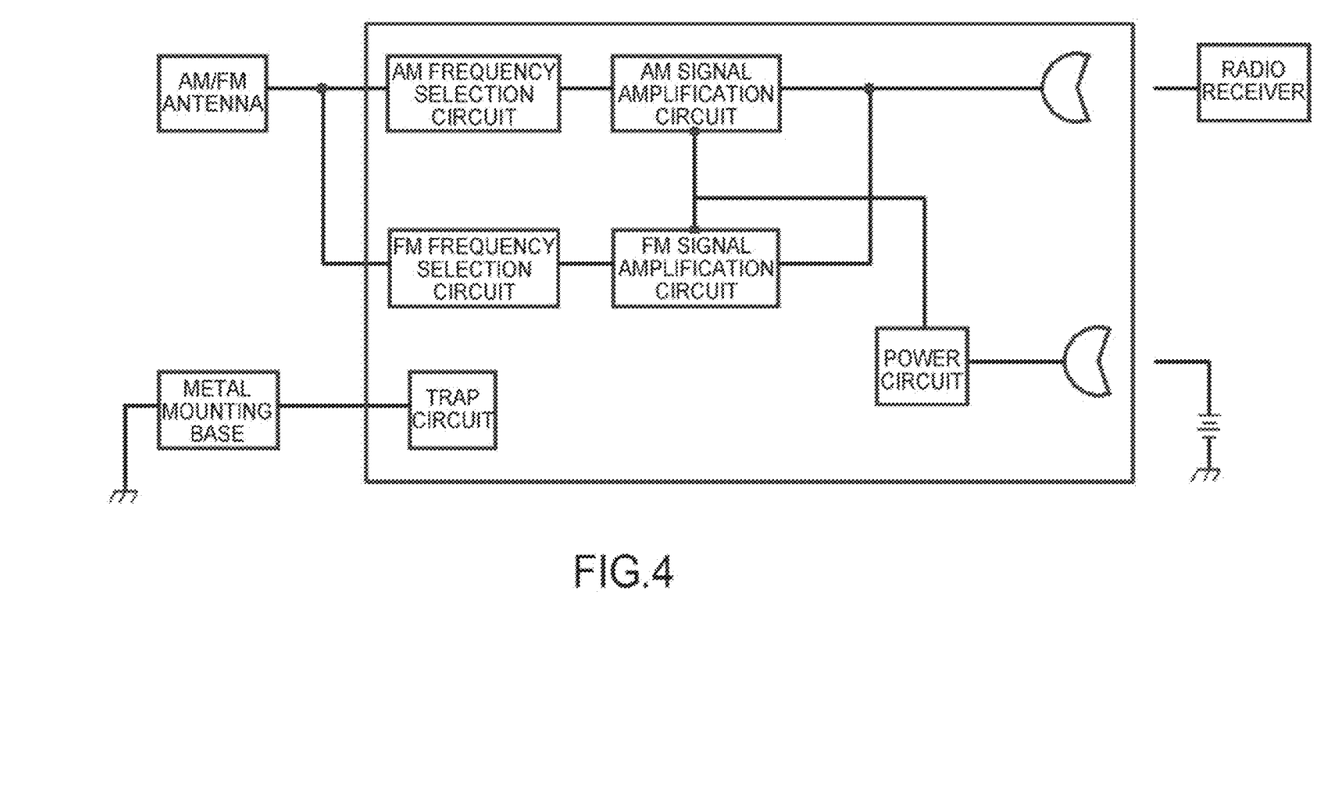
FIG. 4 is a principle block diagram of the antenna amplifier of an example automobile top antenna device.

FIG. 4 is a block diagram of the antenna amplifier. The antenna amplifier includes an AM frequency selection circuit, an AM signal amplification circuit, an FM frequency selection circuit, an FM signal amplification circuit, and a power circuit. The AM/FM signal output terminal of the radio receiving antenna is connected to both the AM frequency selection circuit and the FM frequency selection circuit. The AM frequency selection circuit is connected to the AM signal amplification circuit. Signal output terminals of the AM signal amplification circuit and the FM signal amplification circuit are connected to a shared output plug. The ground terminal of the output plug is connected to the ground terminal of the antenna amplifier. The power circuit supplies power to the antenna amplifier. The antenna amplifier is further provided with a trap circuit that has one end connected to the ground terminal of the antenna amplifier, and the other end connected to the metal mounting base for antenna on the automobile top.

Figure 5:
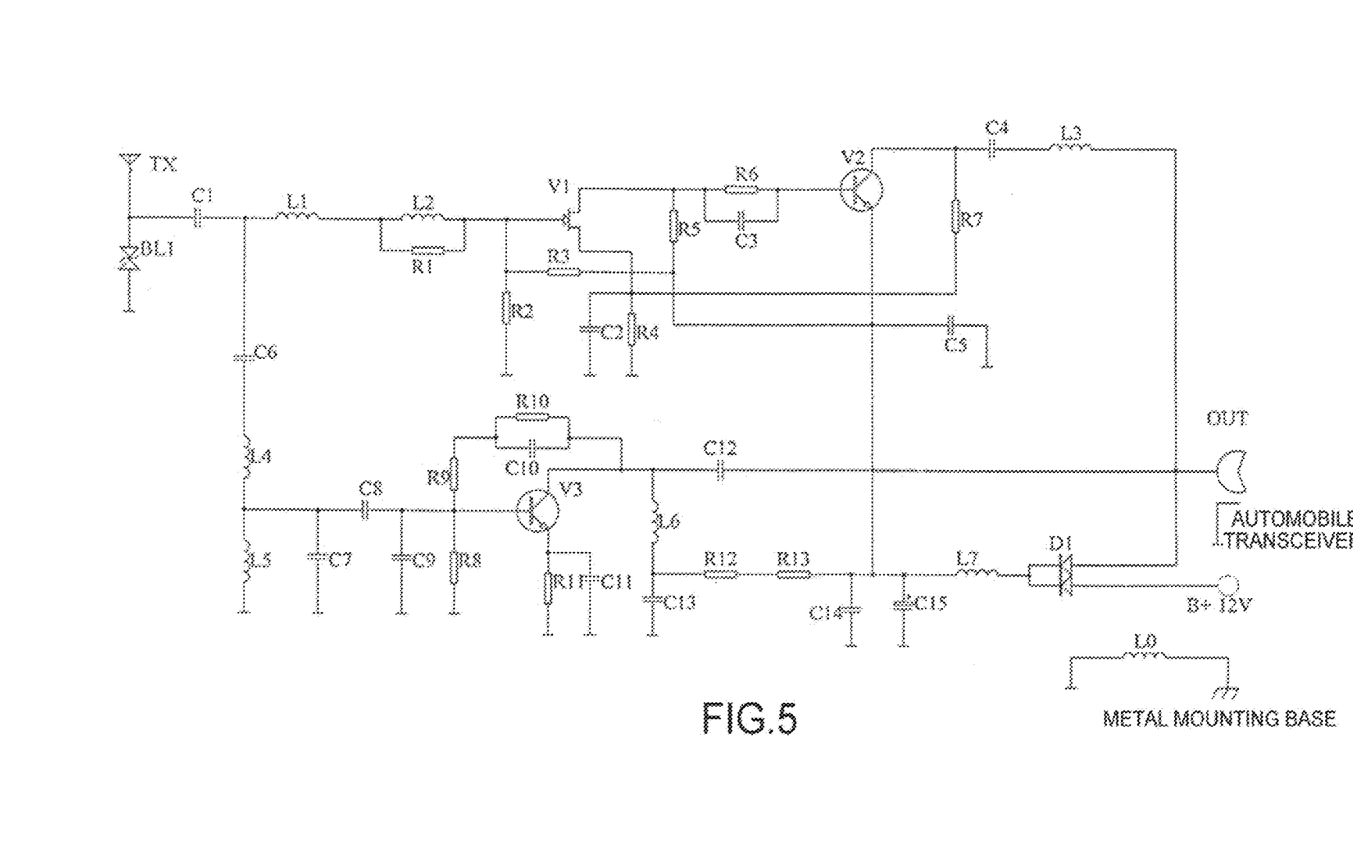
FIG. 5 is a circuit diagram of an example antenna amplifier of the automobile top antenna device.

In an example shown in FIG. 5, the trap circuit includes a printed inductance L0 having one end connected to the ground terminal of the antenna amplifier, and the other end connected to the metal mounting base for the antenna on the automobile top. The printed inductance L0 can be an inductance made of printed wirings on the printed circuit board.

FIG. 5 is a circuit diagram of an example antenna amplifier. As shown in FIG. 5, the AM frequency selection circuit of the antenna amplifier includes a capacitor C1, inductances L1 and L2, and a resistance R1. An antenna TX is connected to the inductance L1 in the AM frequency selection circuit. The inductance L2 is connected to the resistance R1 in parallel and then having one end connected to the inductance L1 and the other end connected to the AM signal amplification circuit.

The AM signal amplification circuit includes a field effect transistor V1, a triode V2, resistors R2~R7, capacitors C2~C5 and an inductance L3. The signal of the AM frequency selection circuit is transmitted to the shared output plug OUT after two stages of amplification by the field effect transistor V1 and the triode V2 of the AM signal amplification circuit. The gate electrode of the field effect transistor V1 is connected to the AM frequency selection circuit. The source electrode of the field effect transistor V1 is connected to the capacitor C2 and the resistances R4 and R7. The drain electrode of the field effect transistor V1 is connected to the resistances R5 and R6 and the capacitor C3, the other ends of the resistance R6 and the capacitor C3 connected in parallel are connected to the base of the triode V2. The collector of the triode V2 is connected to the other ends of the capacitor C4 and the resistance R7. The emitter of the triode V2 is connected to the inductance L7 and the capacitor C15 in the power circuit. The capacitor C4 is connected to the shared output plug OUT and a double diode D1 through the inductance L3. The field effect transistor V1 can be a MMBFJ310 field effect transistor.

The FM frequency selection circuit includes capacitors C6 to C9 and inductances L4 to L5. The antenna TX is connected to the capacitor C6 in the FM frequency selection circuit through the capacitor C1, the other end of the capacitor C6 is connected to the inductance L4, the other end of the inductance L4 is respectively connected to the inductance L5 and the capacitors C7 and C8. The other end of the inductance L5 is grounded. The ground terminal of the capacitor C7 is also connected to the automobile roof through a resistance. The other end of the capacitor C8 is respectively connected to the capacitor C9 and the FM signal amplification circuit.

The FM signal amplification circuit includes a triode V3, resistances R8 to R13, capacitors C10 to C13 and an inductance L6. The base of the triode V3 is connected to the capacitor C8 and provided with upper and lower bias resistances R9 and R8. The upper bias resistance R9 of the base is connected to the collector of the triode V3 after being connected to the parallel connected resistance R10 and capacitor C10. The collector is connected to the shared output plug OUT through the capacitor C12. One end of the inductance L6 is connected to the collector of the triode V3. The other end of the inductance L6 is connected to the power circuit through the resistances R12 and R13. The emitter of the triode V3 is connected to the emitter resistance R11 and the capacitor C11.

The power circuit includes the double diode D1, capacitors C14 and C15, and an inductance L7. A DC power source of +12V is connected to the inductance L7 via the double diode D1 by means of the conductor wiring. The other end of the inductance L7 is respectively connected to the capacitors C14 and C15, the resistance R13 and the emitter of the triode V2. The double diode D1 can be a 1SS226 double diode.

As shown in FIG. 5, in order to further ensure the receiving performance of the antenna, the antenna TX is connected to an electrostatic protector BL1.

Referring to FIG. 5, the working principle of the antenna amplifier is as follows: the antenna TX converts radio electromagnetic wave signals into electrical signals, which pass through the DC capacitor C1 after the electrostatic protection by the electrostatic protector BL1. One channel of radio signals undergoes frequency selection through the inductances L1, L2 and the resistance R1 in the frequency selection circuit. The AM signals are selected and inputted to the AM signal amplification circuit. After two stages of amplification by the field effect transistor V1 and the triode V2 of the AM signal amplification circuit, the signals of the AM frequency selection circuit are transmitted to the shared output plug OUT for output. The bias resistances R2 and R3 are used to adjust the working current of the field effect transistor V1. The feedback resistance R4 and the capacitor C2 are used to adjust the gain (amplification factor) of the field effect transistor V1. The load resistance R5 is used to adjust the gain of the field effect transistor V1. The bias resistance R6 is used to adjust the working current of the triode V2. The capacitor C3 is a coupling capacitor, which couples the AM electrical signals amplified by the field effect transistor V1 to the base of the triode V2 to further amplify the AM electrical signals. The resistance R7 is the load resistance of the triode V2 and is used to adjust the gain of the triode V2. The capacitor C4 and the inductance L3 perform frequency selection on AM output signals.

Another channel of radio signals undergoes frequency selection through the capacitors C6 to C9 and the inductances L4 and L5 in the FM frequency selection circuit. After voltage division by the capacitors C8 and C9, the FM signals are inputted to the triode V3 in a FM signal amplification circuit for amplification. The amplified signals are coupled to the shared output plug OUT for output through the capacitor C12. The bias resistances R8 to R10 are used to adjust the working current of the triode V3. The resistance R9 and the capacitor C10 are feedback resistance and feedback capacitor of the triode V3 and stabilize the triode V3. The resistance R11 and the resistance C11 adjust the gain of the triode V3. The inductance L6 is a load of the triode V3. The capacitor C13 and the resistances R12, 13 form a power filter circuit of the amplifier.

In the power circuit, the double diode D1 is an isolating diode for the coaxial cable commutating power supplying and independent cable power supplying. The inductance L7 and the capacitors C16, C17 form the filter circuit of the power supply.

One end of the printed inductance L0 of the trap circuit is connected to the ground terminal of the radio amplifier, and the other end is connected to the metal mounting base for the antenna on the automobile top. The printed inductance of the trap circuit has a high inductive reactance within the AM/FM frequency range, so that the ground electric potential of the antenna amplifier on the printed circuit board is increased, the absorption on HF signals by the automobile top is reduced, and the receiving performance of the amplifier is improved.

Figure 1:
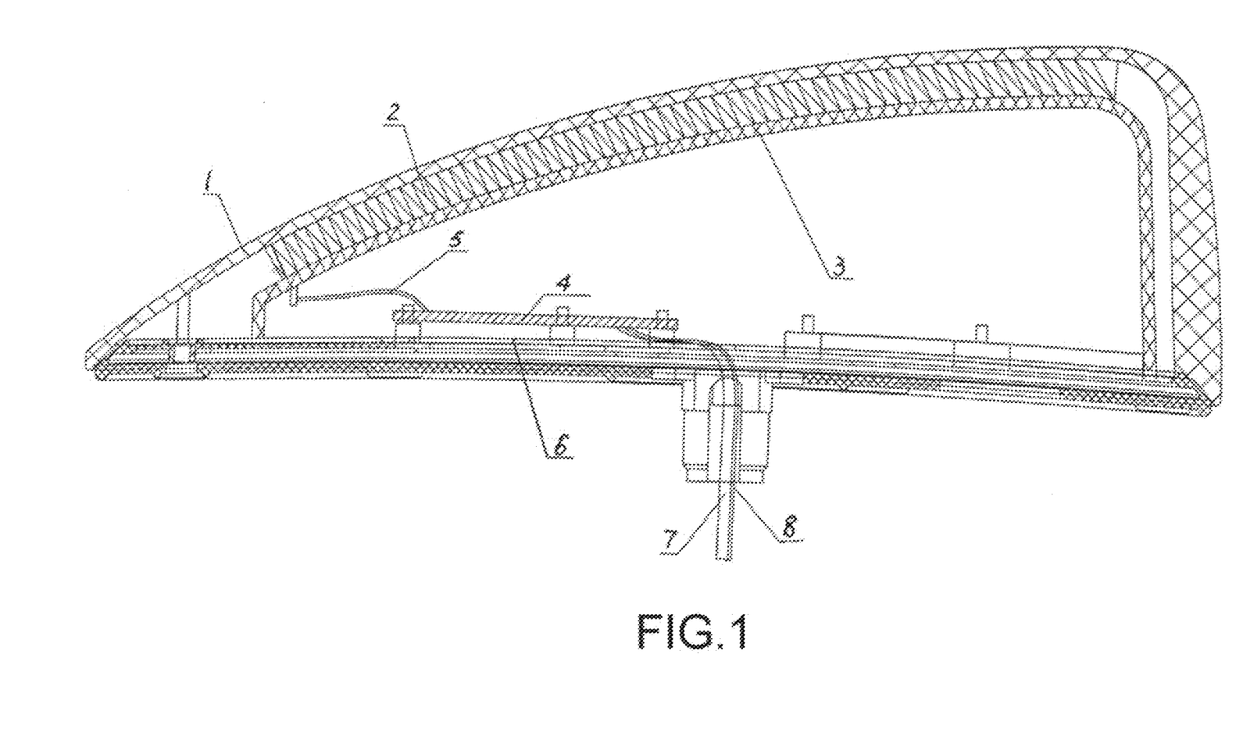
FIG. 1 is a sectional view of a first example automobile top antenna device.
Figure 2:
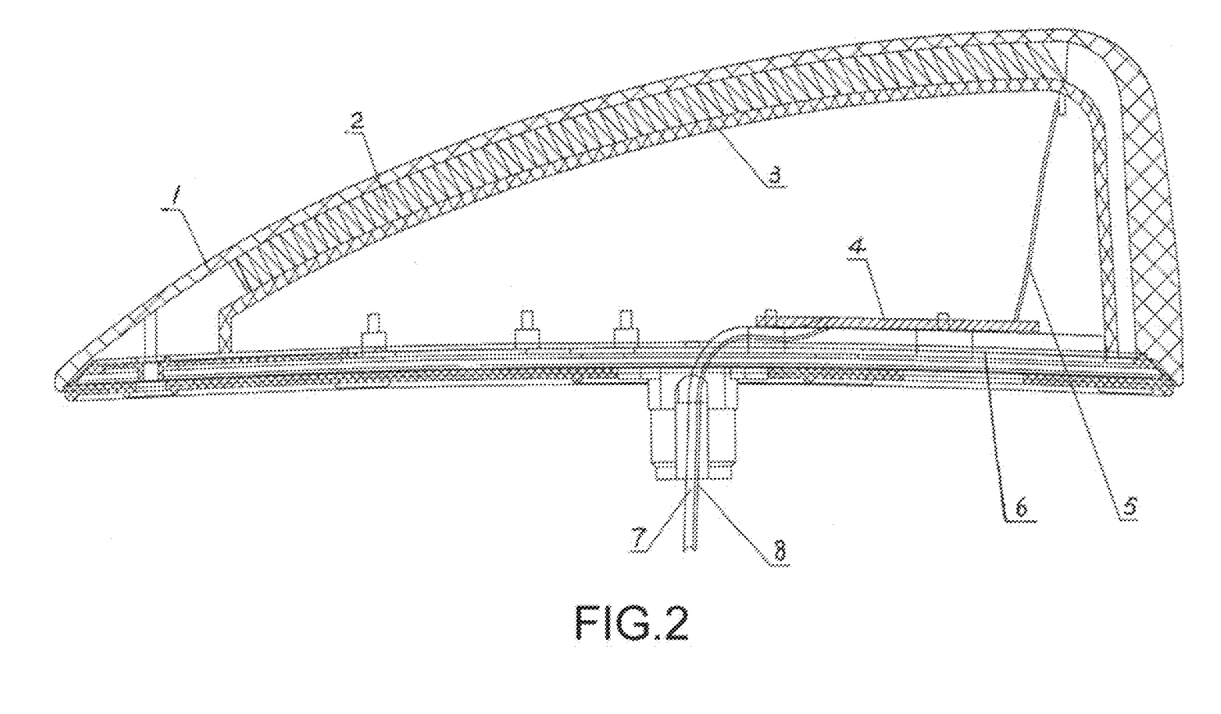
FIG. 2 is a sectional view of a second example automobile top antenna device.
Figure 3:
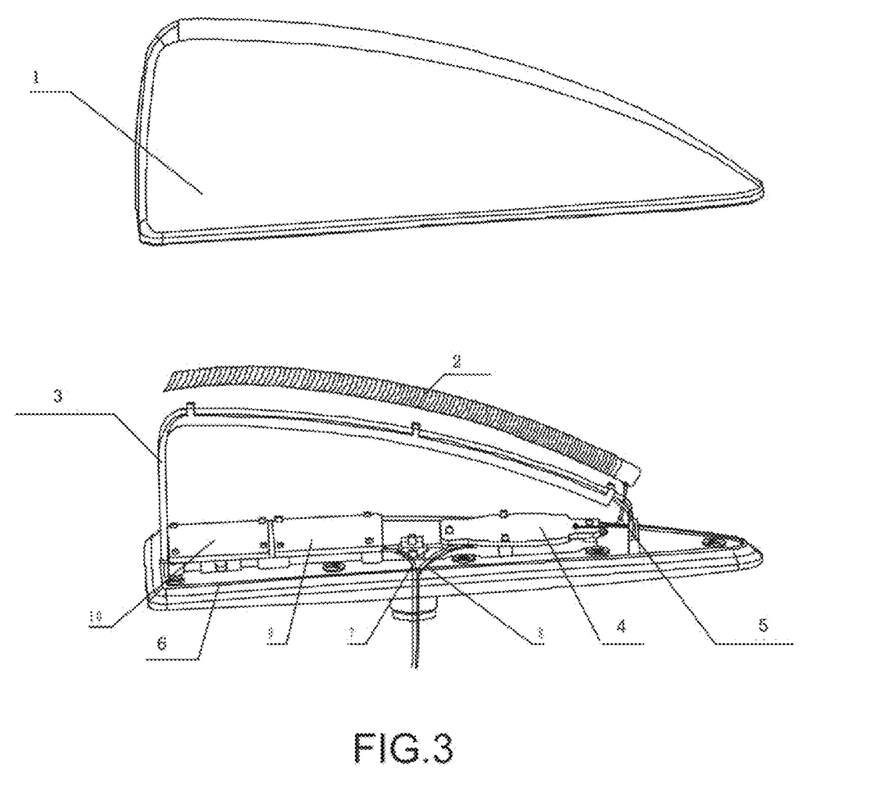
FIG. 3 is a spatial exploded view of a third example automobile top antenna device.

FIGS. 1 to 3 are structural diagrams of a disclosed example automobile top antenna. The shark-fin antenna case 1 is fixed on the metal mounting base 6, which is further provided with an antenna fixing device and a cable connection port. In some examples, the antenna fixing device includes a hollow screw rod and a fixing nut, and the cable connection port is arranged inside the hollow screw rod.

The metal mounting base 6 of the automobile top antenna can be provided with a plurality of circuit board mounting portions, so as to achieve flexible mounting of one or more circuit boards. The mounting portions can be carried out in various manners, such as a buckle structure.

FIG. 1 shows an example automobile top antenna, wherein only one circuit board 4 is provided. An AM/FM antenna amplifier is provided on the circuit board 4, and the output terminal of the radio receiving antenna 2 and the circuit board 4 are both provided on a front end of lower height of the shark-fin antenna case 1.

FIG. 2 shows another example automobile top antenna, wherein still only one circuit board 4 is provided. The output terminal of the radio receiving antenna 2 and the circuit board 4 are both provided on a rear end of larger height of the shark-fin antenna case 1.

FIG. 3 shows another example automobile top antenna, wherein the metal mounting base 6 is provided with three receiving antenna circuit boards 4, 9, 10. Each of the circuit boards 4, 9, 10 includes one or any combination of SDARS satellite digital (numerical) audio receiving antenna circuit board 10, DTV digital (numerical) television receiving antenna circuit board, GPS satellite navigation receiving antenna circuit board 9, and/or DAB digital (numerical) audio receiving antenna circuit board. The concrete combination may be between the SDARS satellite digital audio receiving antenna circuit board 10 and the DTV digital television receiving antenna circuit board, or the SDARS satellite digital audio receiving antenna circuit board 10 and the GPS satellite navigation receiving antenna circuit board 9, or the DTV digital television receiving antenna circuit board and the GPS satellite navigation receiving antenna circuit board 9, etc.

When being used, the automobile top antenna device is mounted at a relevant position on the automobile top outside of the vehicle, and is firmly fixed with the antenna fixing screw rod, screw nut or other fixing parts. After being received by the radio receiving antenna TX, the radio signal is outputted by the antenna signal output terminal to the AM frequency selection circuit and the FM frequency selection circuit, respectively. After a frequency selection by the AM frequency selection circuit, the AM signal is transmitted to the AM signal amplification circuit, and then amplified by the AM signal amplification circuit, and outputted by the shared output plug to an automobile transceiver. After a frequency selection by the FM frequency selection circuit, the FM signal is transmitted to the FM signal amplification circuit, then amplified by the FM signal amplification circuit, and outputted by the shared output plug to the automobile transceiver.

The printed inductance L0 of the trap circuit has a high inductive reactance within the AM/FM frequency range, so that the ground electric potential of the antenna amplifier on the printed circuit board is increased, i.e., the height of the antenna amplifier from the metal mounting base is increased. Thus, the absorption on HF signals by the automobile top is reduced, and the receiving performance of the amplifier is improved.

Figure 6:
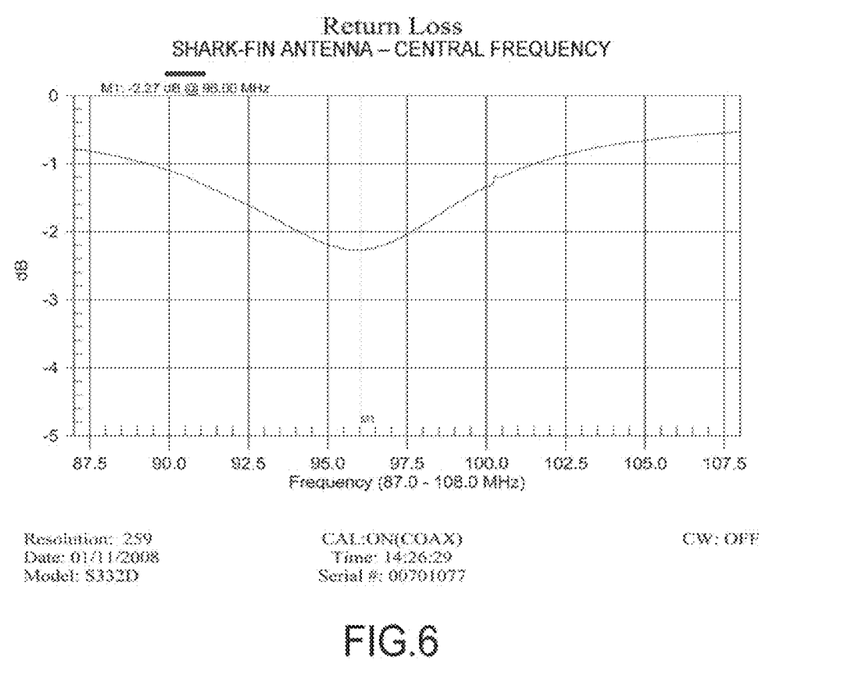
FIG. 6 is a resonant frequency diagram of the radio receiving antenna of the example automobile top antenna device.

The radio receiving antenna of the automobile top antenna device has a resonant frequency of 98±3 MHz, which achieves excellent receiving performance. FIG. 6 is a resonant frequency diagram of an example radio receiving antenna of the automobile top antenna device. As shown in FIG. 6, within the frequency range of 87.5~107.5 MHz, the central frequency point is 96 MHz, which achieves the best signal transmission performance without any frequency point floatation.

Figure 7:
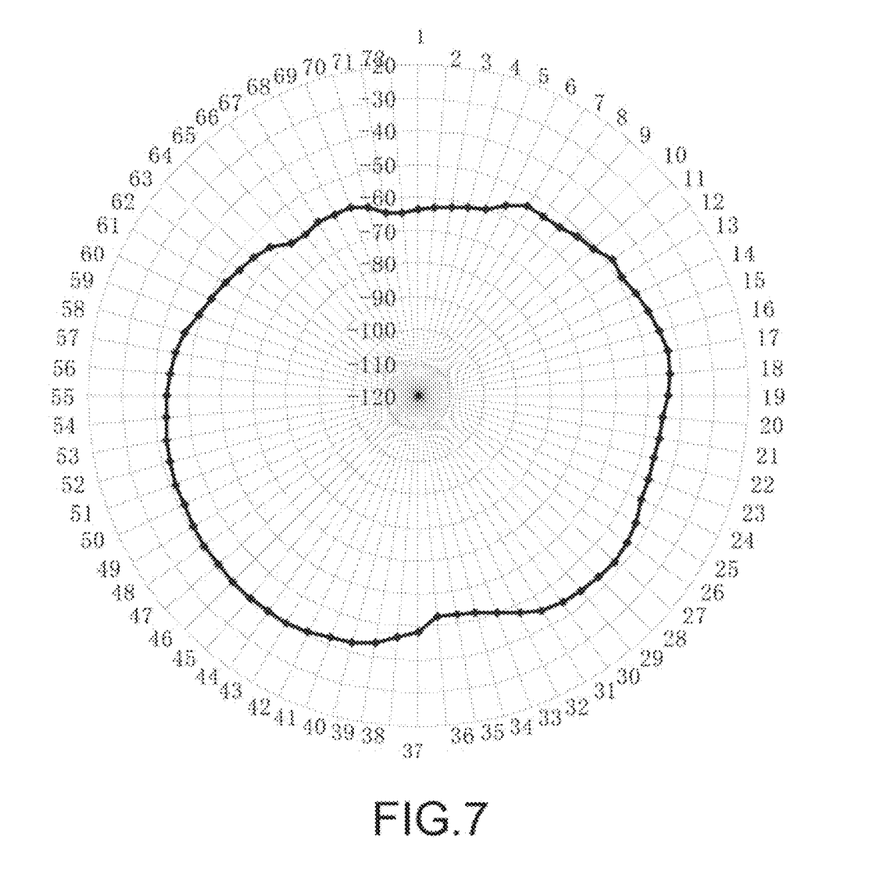
FIG. 7 is a directional diagram (horizontal) of the radio receiving antenna of the automobile top antenna device.
Figure 8:
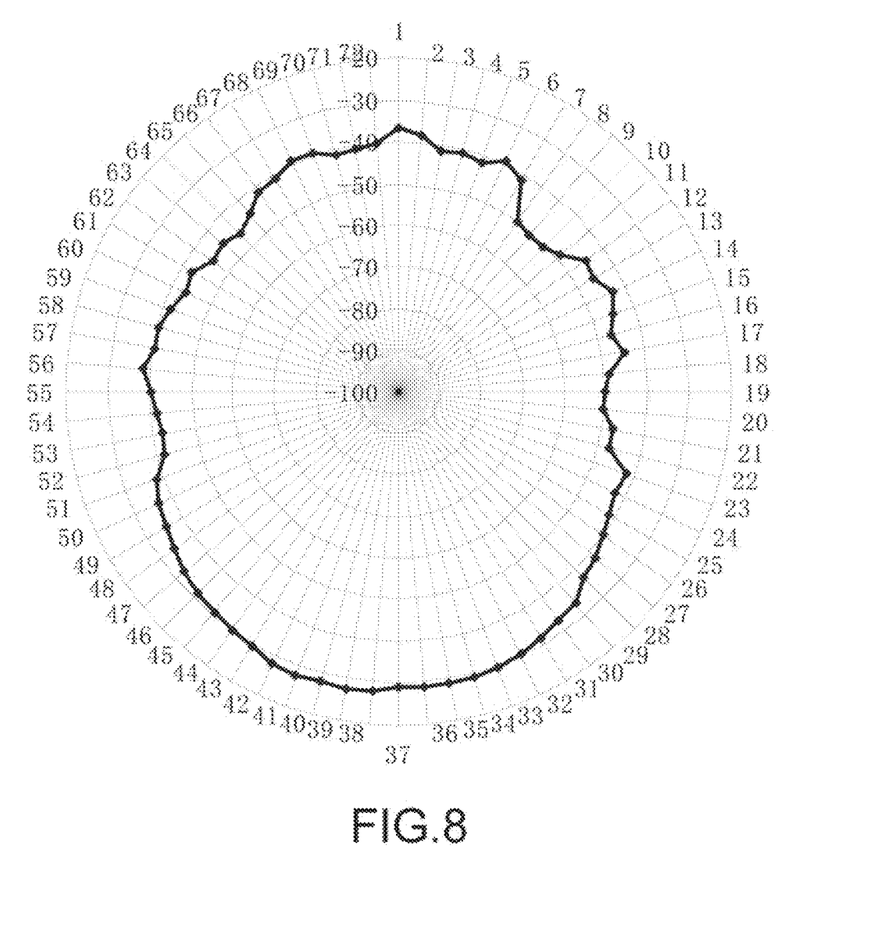
FIG. 8 is a directional diagram (vertical) of the radio receiving antenna of the automobile top antenna device.

FIGS. 7~8 are directional diagrams (horizontal and vertical) of the radio receiving antenna of an example automobile top antenna device, wherein the antenna is mounted on the automobile, and receiving performance tests in horizontal and vertical directions are carried out at the antenna testing field. FIGS. 7~8 show the data measured every five degrees, and each figure contains 72 points to reflect the driving state of the automobile. It can be seen that the receiving antenna of the automobile top antenna device has good receiving performance in the horizontal and vertical directions.

In view of the above reasons, the automobile top antenna device is reasonably and compactly structured. The radio receiving antenna is an AM/FM shared antenna, and the device is inside the antenna case. The antenna case is a shark-fin case of low height and aesthetic appearance. The antenna amplifier is provided with a trap circuit, and the printed inductance L0 of the trap circuit has a high inductive reactance within the AM/FM frequency range, so that the ground electric potential of the antenna amplifier on the printed circuit board is increased, i.e., the height of the antenna amplifier from the metal mounting base is increased, thus the absorption on HF signals by the automobile top is reduced, and the receiving performance of the amplifier is improved. In some examples, the radio antenna of the automobile top antenna device is an AM/FM shared antenna, and the device is inside the antenna case, which achieves a good sealing performance and protects against damage. The antenna is of low height, so that the antenna needs not to be withdrawn when the vehicle on which it is mounted is being washed or entering a limited space, and the usage is very convenient. In addition, the antenna will not drop off during usage, and need not be dismounted during transportation, which is also very convenient.

From the foregoing, persons of ordinary skill in the art will appreciate that antenna amplifiers have been provided that reduce absorption on HF signals by the automobile top, and improve the receiving performance of the amplifier.

In addition, automobile top antenna devices have been provided which overcome the above defects of prior automobile top antennas.

In some examples, an antenna amplifier for an automobile top antenna, includes an AM frequency selection circuit, an AM signal amplification circuit, an FM frequency selection circuit, an FM signal amplification circuit, and a power circuit. An AM/FM signal output terminal of a radio receiving antenna is connected to both the AM frequency selection circuit and the FM frequency selection circuit. The AM frequency selection circuit is connected to the AM signal amplification circuit. The FM frequency selection circuit is connected to the FM signal amplification circuit. Signal output terminals of the AM signal amplification circuit and the FM signal amplification circuit are connected to a shared output plug. A ground terminal of the output plug is connected to a ground terminal of the antenna amplifier. The power circuit supplies power to the antenna amplifier. The antenna amplifier is further provided with a trap circuit that has one end connected to the ground terminal of the antenna amplifier, and the other end connected to a metal mounting base for an antenna on the automobile top.

In some examples, an automobile top antenna device, comprises an antenna case, a metal mounting base, an antenna support and a radio receiving antenna. The antenna case is mounted on the metal mounting base to form an internal accommodation space in which the antenna support, the radio receiving antenna and a circuit board disposed with an antenna amplifier are provided. The antenna support and the circuit board are provided on the metal mounting base. The radio receiving antenna is provided on the antenna support, or imbedded by injection molding or clamped by fixation to an upper part inside the antenna case. One end of the radio receiving antenna is provided with an antenna signal output terminal connected to a signal input terminal of the antenna amplifier. A signal of the antenna amplifier is outputted to a radio receiving device through a coaxial cable. The antenna amplifier is provided with a trap circuit that has one end connected to a ground terminal of the antenna amplifier, and the other end connected to the metal mounting base for the antenna on the automobile top.

In examples illustrated herein, the antenna amplifier is provided with the trap circuit, and the printed inductance L0 of the trap circuit has a high inductive reactance within the AM/FM frequency range, so that the ground electric potential of the antenna amplifier on the printed circuit board is increased, i.e., the height of the antenna amplifier from the metal mounting base is increased and, thus, the absorption on HF signals by the automobile top is reduced, and the receiving performance of the amplifier is improved. In addition, the radio receiving antenna is an AM/FM shared antenna mounted on the antenna support inside the antenna case. The antenna case can be a shark-fin case of low height and aesthetic appearance.

It is noted that this patent claims priority from Chinese Patent Application Serial Number 200710192378.6, which was filed on Dec. 26, 2007, and is hereby incorporated by reference in its entirety.

Although certain example methods, apparatus and articles of manufacture have been described herein, the scope of coverage of this patent is not limited thereto. On the contrary, this patent covers all methods, apparatus and articles of manufacture fairly falling within the scope of the appended claims either literally or under the doctrine of equivalents.

What is claimed is:

1. An antenna amplifier for an automobile top antenna, the antenna amplifier comprising:
   an AM signal amplification circuit;
   an AM frequency selection circuit comprising a capacitor, first and second inductances, and a resistance, the AM frequency selection circuit in circuit with the AM signal amplification circuit;

an antenna in circuit with the first inductance in the AM frequency selection circuit through the capacitor, the second inductance is connected to the resistance in parallel, the second inductance comprising a first end in circuit with the first inductance and a second end in circuit with the AM signal amplification circuit;

an FM signal amplification circuit;

an FM frequency selection circuit in circuit with the FM signal amplification circuit;

a power circuit;

an AM/FM signal output terminal of a radio receiving antenna in circuit with both the AM frequency selection circuit and the FM frequency selection circuit, signal output terminals of the AM signal amplification circuit and the FM signal amplification circuit in circuit with a shared output plug, a ground terminal of the output plug in circuit with a ground terminal of the antenna amplifier, the power circuit to supply power to the antenna amplifier; and a trap circuit having a first end in circuit with the ground terminal of the antenna amplifier and a second end in circuit with a metal mounting base for the antenna on the automobile, the trap circuit comprising a printed inductance having a first end in circuit with the ground terminal of the antenna amplifier and a second end in circuit with the metal mounting base of the automobile antenna.

2. The antenna amplifier according to claim 1, wherein the AM signal amplification circuit comprises two stages of amplification circuits, and a signal of the AM frequency selection circuit is transmitted to the shared output plug after two stages of amplification by a field effect transistor and a first triode of the AM signal amplification circuit.

3. The antenna amplifier according to claim 2, wherein the first stage amplification circuit comprises a field effect transistor amplification circuit, and the second stage amplification circuit comprises a triode amplification circuit, the field effect transistor comprising a gate electrode, the gate electrode in circuit with second and third resistances, the field effect transistor further comprising a drain electrode, the drain electrode in circuit with a fifth resistance, and the field effect transistor further comprising a source electrode, the source electrode in circuit with a fourth resistance and a second capacitor; the first triode of the second stage amplification circuit comprising a base in circuit with a sixth resistance and a third capacitor, and the first triode further comprising a collector in circuit with a seventh resistance; the gate electrode of the field effect transistor in circuit with the AM frequency selection circuit, the drain electrode of the field effect transistor in circuit with the fifth resistance and the base of the first triode through a parallel connected third capacitor and sixth resistance, an emitter of the first triode in circuit with the power circuit, the collector of the first triode in circuit with the seventh resistance and to the shared output plug.

4. The antenna amplifier according to claim 3, wherein the AM signal amplification circuit further comprises an output signal frequency selection circuit having a fourth capacitor and a third inductance, the collector of the first triode in circuit with the shared output plug through the fourth capacitor and the third inductance of the output signal frequency selection circuit.

5. The antenna amplifier according to claim 4, wherein the FM frequency selection circuit comprises a sixth capacitor, fourth and fifth inductances, and seventh, eighth and ninth capacitors; the antenna in circuit with the sixth capacitor of the FM frequency selection circuit through the first capacitor, the second end of the sixth capacitor is connected to the fourth inductance, the second end of the fourth inductance is respectively connected to the fifth inductance and the seventh and eighth capacitors, the second end of the eighth capacitor is respectively connected to the ninth capacitor and the FM signal amplification circuit, the second end of the seventh capacitor is grounded to the automobile roof through a capacitor.

6. The antenna amplifier according to claim 5, wherein the FM signal amplification circuit comprises a second triode, eighth, ninth, tenth, eleventh twelfth and thirteenth resistances, tenth, eleventh twelfth and thirteenth capacitors and a sixth inductance; a base of the second triode is connected to the eighth capacitor and provided with upper and lower bias resistances, the upper bias resistance of the base is connected a collector of the second triode and in circuit with a parallel connected tenth resistance and a tenth capacitor, the collector of the second triode in circuit with the shared output plug through the twelfth capacitor, the sixth inductance has a first end connected to in circuit with the collector of the second triode and the second end in circuit with the power circuit through the twelfth and thirteenth resistances, an emitter of the second triode in circuit with an emitter resistance and a bypass capacitor.

7. The antenna amplifier according to claim 6, wherein the power circuit comprises a double diode, fourteenth and fifteenth capacitors and a seventh inductance; a DC power source in circuit with the seventh inductance via the double diode, the second end of the seventh inductance is respectively in circuit with the fourteenth and fifteenth capacitors, the thirteenth resistance and the emitter of the first triode.

8. The antenna amplifier according to claim 7, wherein the antenna is connected to an electrostatic protector.

9. An antenna amplifier for an automobile top antenna, the antenna amplifier comprising:

an AM frequency selection circuit;
an AM signal amplification circuit
an FM frequency selection circuit
an FM signal amplification circuit
a power circuit
an AM/FM signal output terminal of a radio receiving antenna in circuit with both the AM frequency selection circuit and the FM frequency selection circuit, the AM frequency selection circuit in circuit with the AM signal amplification circuit, the FM frequency selection circuit in circuit with the FM signal amplification circuit, signal output terminals of the AM signal amplification circuit and the FM signal amplification circuit in circuit with a shared output plug, a ground terminal of the output plug in circuit with a ground terminal of the antenna amplifier, the power circuit to supply power to the antenna amplifier;

a metal mounting base for the automobile top antenna;

a trap circuit comprising a first end in circuit with the ground terminal of the antenna amplifier, and a second end in circuit with the metal mounting base, the metal mounting base to provide a grounding path via the trap circuit, wherein the trap circuit comprises a printed inductance having a first end in circuit with the ground terminal of the antenna amplifier, and a second end in circuit with the metal mounting base, wherein the AM frequency selection circuit of the antenna amplifier comprises a capacitor, first and second inductances, and a resistance; an antenna in circuit with the first inductance in the AM frequency selection circuit through the capacitor, the second inductance connected in parallel with the resistance, the second inductance comprising a first end connected to the first inductance and a second end connected to the AM signal amplification circuit.

10. The antenna amplifier according to claim 9, wherein the AM signal amplification circuit comprises two stages of amplification circuits, and a signal of the AM frequency selection circuit is transmitted to the shared output plug after two stages of amplification by a field effect transistor and a first triode of the AM signal amplification circuit.

11. The antenna amplifier according to claim 10, wherein the first stage amplification circuit comprises a field effect transistor amplification circuit, and the second stage amplification circuit comprises a triode amplification circuit, the field effect transistor comprising a gate electrode, the gate electrode connected to second and third resistances, the field effect transistor further comprising a drain electrode, the drain electrode connected to a fifth resistance, and the field effect transistor further comprising a source electrode, the source electrode connected to a fourth resistance and a second capacitor; the first triode of the second stage amplification circuit comprising a base connected to a sixth resistance and a third capacitor, and the first triode further comprising a collector connected to a seventh resistance; the gate electrode of the field effect transistor in circuit with the AM frequency selection circuit, the drain electrode of the field effect transistor connected to the fifth resistance and to the base of the first triode through a parallel connected third capacitor and sixth resistance, an emitter of the first triode in circuit with the power circuit, the collector of the first triode connected to the seventh resistance and simultaneously to the shared output plug.

12. The antenna amplifier according to claim 10, wherein the AM signal amplification circuit further comprises an output signal frequency selection circuit having a fourth capacitor and a third inductance, the collector of the first triode connected to the shared output plug through the fourth capacitor and the third inductance of the output signal frequency selection circuit.

13. The antenna amplifier according to claim 12, wherein the FM frequency selection circuit comprises a sixth capacitor, fourth and fifth inductances, and seventh, eighth and ninth capacitors; the antenna connected to the sixth capacitor of the FM frequency selection circuit through the first capacitor, the second end of the sixth capacitor in circuit with the fourth inductance, the second end of the fourth inductance is in circuit with the fifth inductance and the seventh and eighth capacitors, the second end of the eighth capacitor is respectively connected to the ninth capacitor and the FM signal amplification circuit, the second end of the seventh capacitor is grounded to the automobile roof through a capacitor.

14. The antenna amplifier according to claim 13, wherein the FM signal amplification circuit comprises a second triode, eighth, ninth, tenth, eleventh twelfth and thirteenth resistances, tenth, eleventh twelfth and thirteenth capacitors and a sixth inductance; a base of the second triode connected to the eighth capacitor and provided with upper and lower bias resistances, the upper bias resistance of the base connected to a collector of the second triode and connected to a parallel connected tenth resistance and a tenth capacitor, the collector of the second triode connected to the shared output plug through the twelfth capacitor, the sixth inductance has a first end connected to the collector of the second triode and the second end in circuit with the power circuit through the twelfth and thirteenth resistances, an emitter of the second triode connected to an emitter resistance and a bypass capacitor.

15. The antenna amplifier according to claim 14, wherein the power circuit comprises a double diode, fourteenth and fifteenth capacitors and a seventh inductance; a DC power source in circuit with the seventh inductance via the double diode, the second end of the seventh inductance is respectively in circuit with the fourteenth and fifteenth capacitors, the thirteenth resistance and the emitter of the first triode.

16. The antenna amplifier according to claim 15, wherein the antenna is connected to an electrostatic protector.

\* \* \* \* \*